(12) United States Patent
Khasiev et al.

(10) Patent No.: US 7,551,007 B2
(45) Date of Patent: Jun. 23, 2009

(54) PARTIAL SWITCH GATE DRIVER

(75) Inventors: Victor Khasiev, Livermore, CA (US); Ronald Berthiaume, San Jose, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 11/903,338

(22) Filed: Sep. 21, 2007

(65) Prior Publication Data

US 2008/0012622 A1   Jan. 17, 2008

Related U.S. Application Data

(63) Continuation of application No. 11/056,479, filed on Feb. 11, 2005, now abandoned.

(51) Int. Cl.
   *H03K 3/00* (2006.01)
(52) U.S. Cl. .................................. 327/108; 326/83
(58) Field of Classification Search ............... 327/108; 326/83
   See application file for complete search history.

(56) References Cited

U.S. PATENT DOCUMENTS

| | | | |
|---|---|---|---|
| 4,065,678 A * | 12/1977 | Reese et al. ................. 327/323 |
| 4,972,130 A | 11/1990 | Rossi et al. | |
| 5,099,138 A * | 3/1992 | Fukunaga ................... 327/109 |
| 5,343,084 A * | 8/1994 | Gens ........................... 327/111 |
| 5,631,588 A * | 5/1997 | Bertolini ...................... 327/108 |
| 5,729,165 A | 3/1998 | Lou et al. | |
| 5,760,620 A | 6/1998 | Doluca | |
| 6,018,256 A * | 1/2000 | Kumagai et al. ............. 327/112 |
| 6,094,079 A | 7/2000 | Boggs et al. | |
| 6,359,478 B1 | 3/2002 | Chow | |
| 6,535,035 B2 | 3/2003 | Ziemer | |
| 6,552,583 B1 | 4/2003 | Kwong | |
| 6,897,683 B2 | 5/2005 | Kernahan et al. | |
| 6,977,533 B2 * | 12/2005 | Kernhof et al. ............. 327/110 |
| 7,038,524 B2 | 5/2006 | Balakrishnan | |
| 7,046,050 B1 | 5/2006 | Schottler | |
| 7,071,740 B2 * | 7/2006 | Adams et al. ............... 327/110 |
| 7,088,151 B1 | 8/2006 | Dequina et al. | |
| 7,091,752 B2 | 8/2006 | Balakrishnan | |

* cited by examiner

*Primary Examiner*—Kenneth B. Wells
(74) *Attorney, Agent, or Firm*—Sidley Austin LLP

(57) ABSTRACT

A power switch driver includes a top driver switch, a bottom driver switch, a driver node between them, and driver logic. The power switch driver can turn on the power switch by controlling a gate voltage of the power switch to a first voltage level and to turn off the power switch by controlling the gate voltage from a lower second voltage level. The driver logic may include a pulse width generator programmer and a pulse width generator. The pulse width generator is controlled by the pulse width generator programmer and an input signal. Some power switch drivers include a feedback loop, coupled to the driver node and to the driver logic. The feedback loop may include a track-and-hold circuit, coupled to the driver node, to the pulse width generator through an error amplifier and to the input terminal.

19 Claims, 20 Drawing Sheets

PARTIAL SWITCH GATE DRIVER

CROSS-REFERENCE TO RELATED APPLICATION

The present application is a continuation of U.S. patent application Ser. No. 11/056,479, filed on Feb. 11, 2005, now abandoned, the entirety of which is incorporated by reference herein.

BACKGROUND

1. Field of Invention

The present invention relates to power switch drivers and more particularly to drivers using programmed pulse width generators.

2. Description of Related Art

Power switches play an essential role in modem electronics. Their control, or driver circuitry is getting ever more sophisticated. Some of the guiding principles of designing power switch drivers include reducing the switching time of the power switches and to reduce the losses related to the switching process.

Unfortunately, these design principles lead to contradictory criteria. As explained in detail below in relation to FIG. 5, switching times can be shortened by increasing the operating voltages, whereas losses can be reduced by lowering the operating voltages. These contradictory criteria pose a challenge to the designers of modern power switch drivers.

SUMMARY

Briefly and generally, embodiments of the invention include a power switch driver, including a top driver switch coupled between a first voltage rail and a driver node, a bottom driver switch, coupled between the driver node and a second voltage rail, and driver logic, operationally coupled to the top driver switch and the bottom driver switch, wherein the power switch driver is connectable to a power switch, and the power switch driver is operable to turn on the power switch by controlling a gate voltage of the power switch to a first voltage level and to turn off the power switch by controlling the gate voltage from a second voltage level, wherein the second voltage level is lower than the first voltage level.

In some embodiments, the driver logic includes a pulse width generator programmer and a pulse width generator. The pulse width generator is controlled by the pulse width generator programmer and an input signal.

Some embodiments include a feedback loop, coupled to the driver node and to the driver logic. The feedback loop may include a track-and-hold circuit, coupled to the driver node, to the pulse width generator through an error amplifier and to the input terminal.

According to embodiments of the inventions, a method of operating a power switch driver includes turning on the power switch by controlling a voltage of a gate of the power switch to a first voltage level, causing the gate voltage to decay from the first voltage level to a second voltage level, and turning off the power switch by controlling the gate voltage from the second voltage level, wherein the second voltage level is lower than the first voltage level.

DETAILED DESCRIPTION

Embodiments of the present invention and their advantages are best understood by referring to FIGS. 1-20 of the drawings. Like numerals are used for like and corresponding parts of the various drawings.

Figure 1:
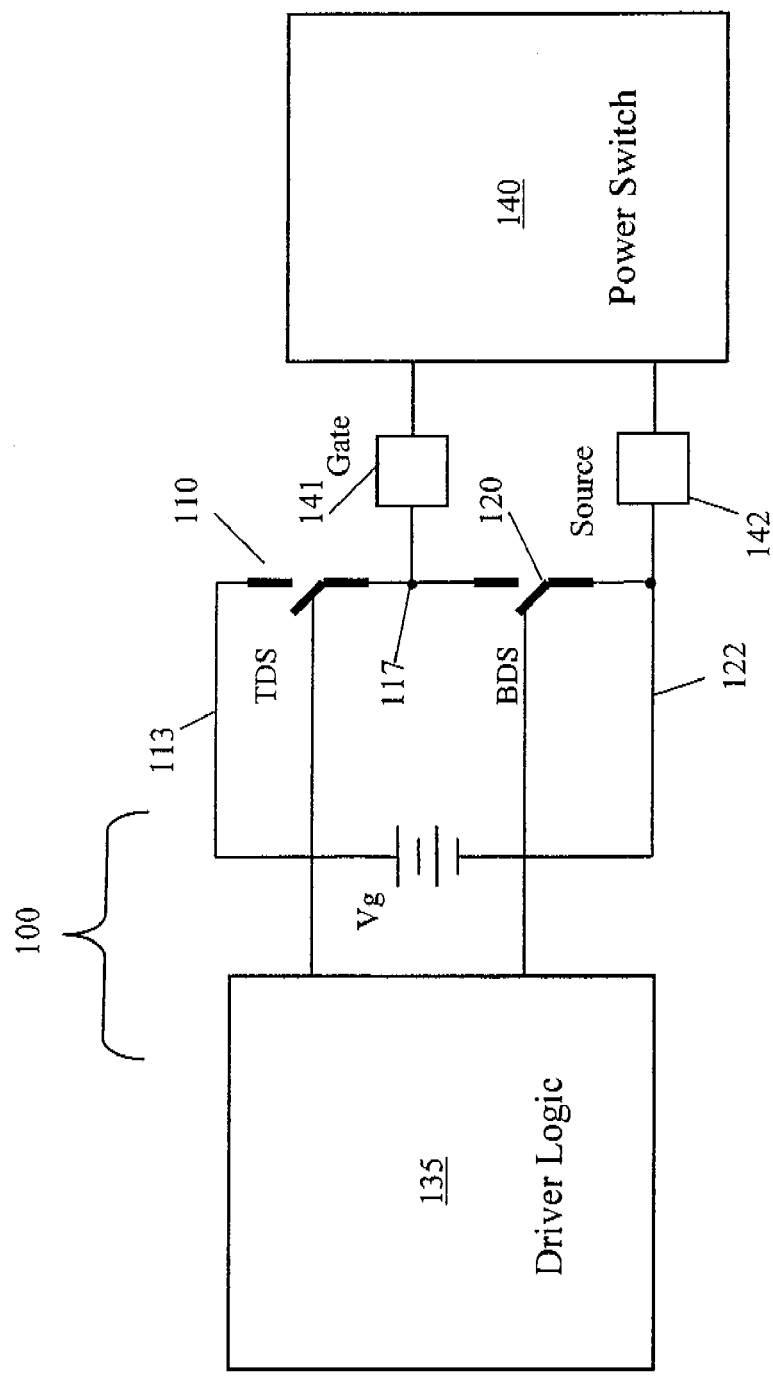
FIG. 1 illustrates a block diagram of a power switch driver, according to an embodiment of the invention.

FIG. 1 illustrates a power switch driver 100 according to embodiments of the invention. Power switch driver 100 includes a top driver switch 110, coupled between a first voltage rail 113 and a driver node 117. Power driver also includes a bottom driver switch 120, coupled between driver node 117 and a second voltage rail 122. Power driver 100 is also coupled to driver logic 135, operationally coupled to top driver switch 110 and bottom driver switch 120.

Power switch driver 100 can drive a power switch 140. FIG. 1 illustrates that power switch driver 100 can be connected to power switch 140 by coupling a power switch gate 141 of power switch 140 to driver node 117 and a power switch source 142 to second voltage rail 122. In some embodiments power switch 140 can be an n-channel MOSFET, a p-channel MOSFET, a bipolar transistor, or an insulated gate bipolar transistor.

The voltage supplied to first voltage rail 113 is denoted by Vg0. Second voltage rail 122 can be a ground.

Figure 2:
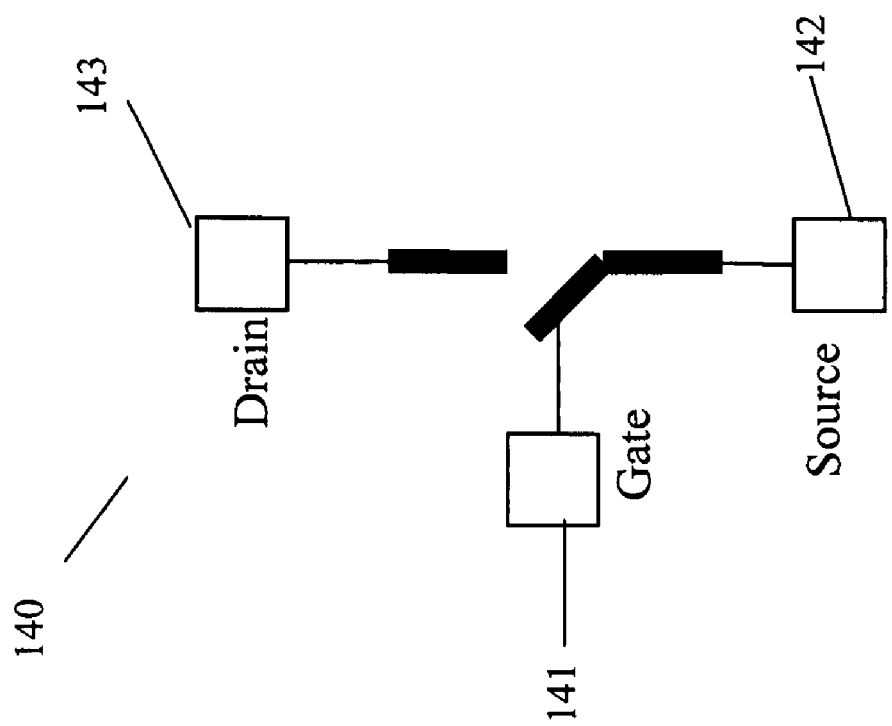
FIG. 2 illustrates a power switch.

FIG. 2 illustrates a typical structure of power switch 140. Power switch 140 includes power switch gate 141, power switch source 142, and power switch drain 143. Voltage applied to power switch gate 141 controls whether current can flow between power switch source 142 and power switch drain 143, effectively turning power switch 140 on and off.

Figure 3:
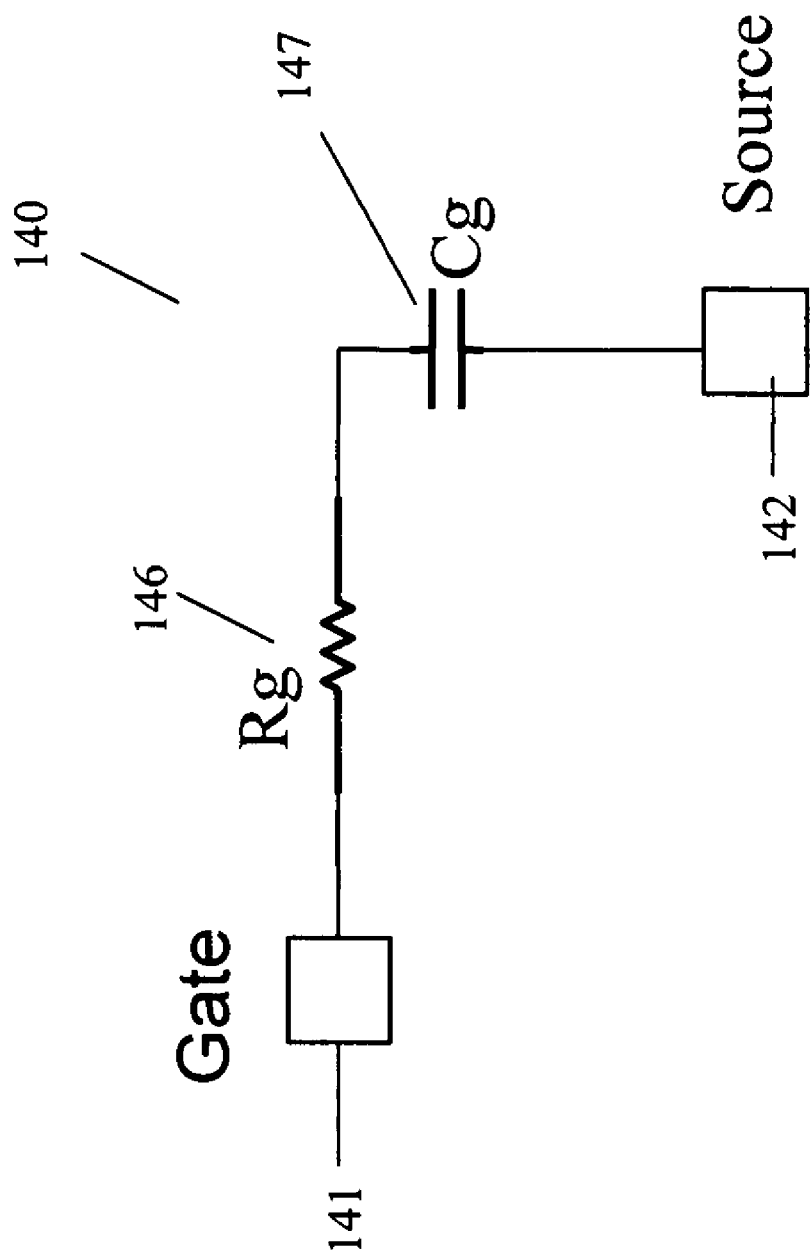
FIG. 3 illustrates an equivalent circuit of a power switch.

FIG. 3 illustrates that when power switch gate 141 is closed, an equivalent circuit of power switch 140 includes a gate resistor 146 and a gate capacitor 147, coupled in series between power switch gate 141 and power switch source 142.

Figure 4:
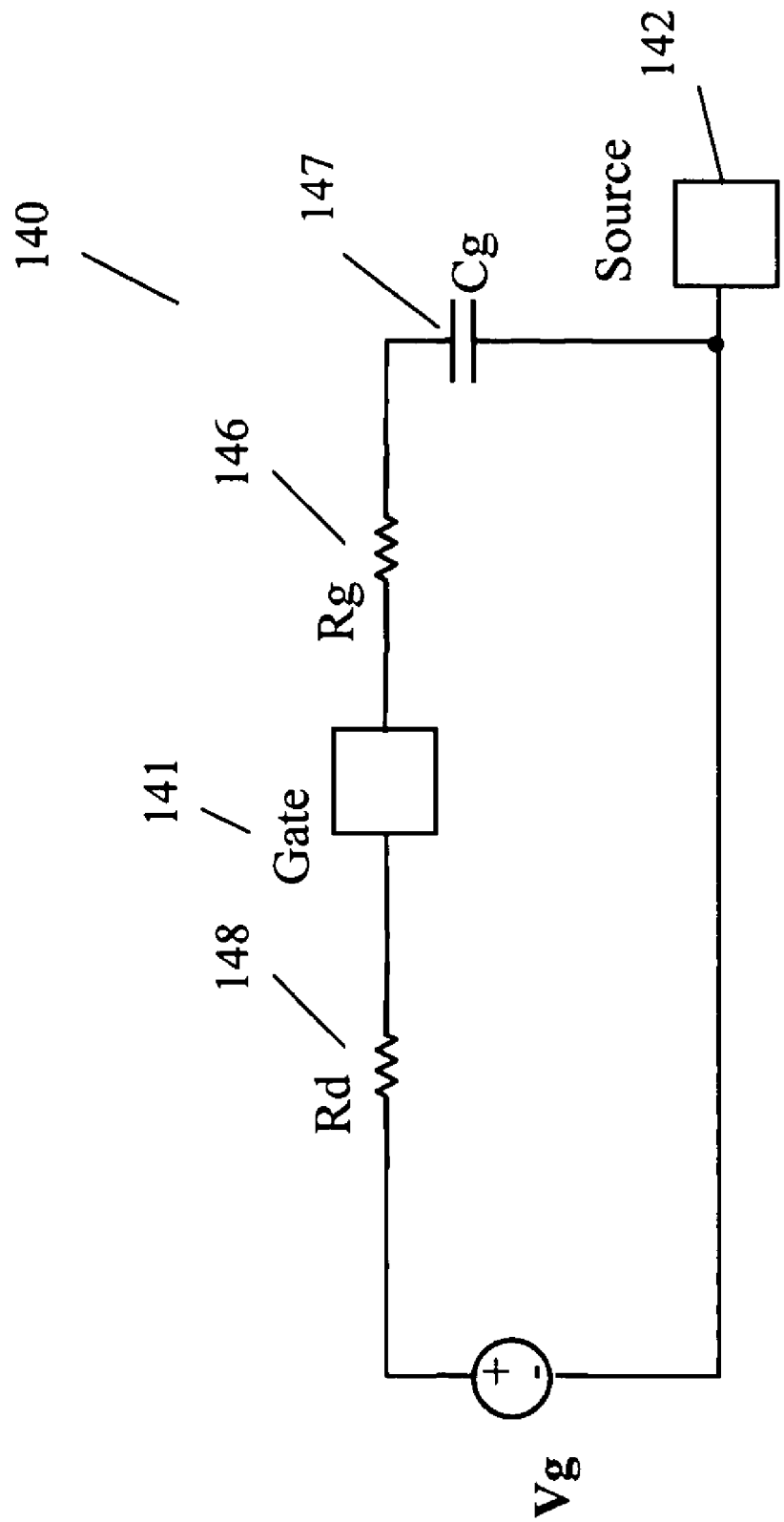
FIG. 4 illustrates an equivalent circuit of a driven power switch.

FIG. 4 illustrates that for the purposes of the outside circuitry the equivalent circuit includes an additional Rd resistor 148.

Figure 5:
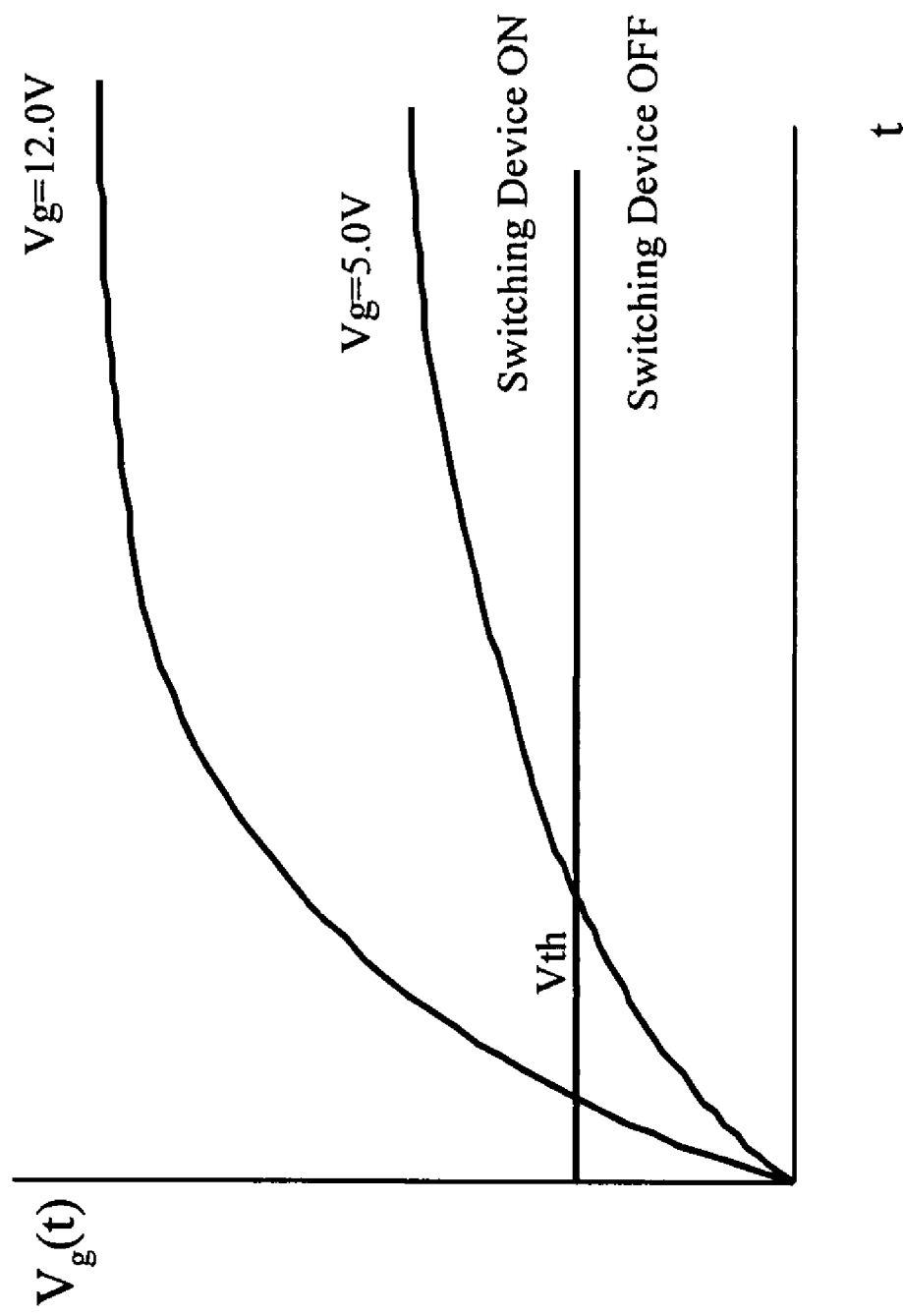
FIG. 5 illustrates the time dependence of a gate voltage for high and low applied voltages.

FIG. 5 is a plot of the time dependence, or wave form, of the gate voltage Vg(t) of power switch gate 141 for different applied gate voltages Vg0. Vg(t) is different from Vg0 because of the voltage drop across Rd resistor 148 when the charging current flows. Also, Vg(t) is different from the voltage of gate capacitor 147 because of the voltage drop across gate resistor 146 due to the charging current. The upper curve corresponds to a Vg0=12V, the lower to Vg0=5V. Vg(t) has this transient curve, because Vg0 has to charge gate capacitor 147. This gives rise to an exponential transient with a time constant τ=RgCg, or, including Rd resistor 148, τ'=(Rg+Rd)Cg. In both cases power switch 140 switching on, when gate voltage Vg(t) exceeds a threshold value Vth. It is clear from the plot that for lower values of Vg0 it takes a longer time for power switch 140 to switch on. As discussed in the introduction, requirements of high-speed operations therefore prefer higher values for Vg0. On the other hand, higher values of Vg0 lead to higher losses when switching off power switch 140. Therefore, requirements of low losses prefer low values of Vg0, at least at the time of the switching off.

Embodiments of the invention resolve this apparent contradiction of design requirements in the following manner. Power switch 140 is turned on by controlling Vg(t), the gate voltage of power switch gate 141 to a first level Vg1, then reduce Vg(t) to a second, lower level Vg2, finally turn power switch 140 off by controlling Vg(t) from this second level to a low level, such as the ground.

Figure 6:
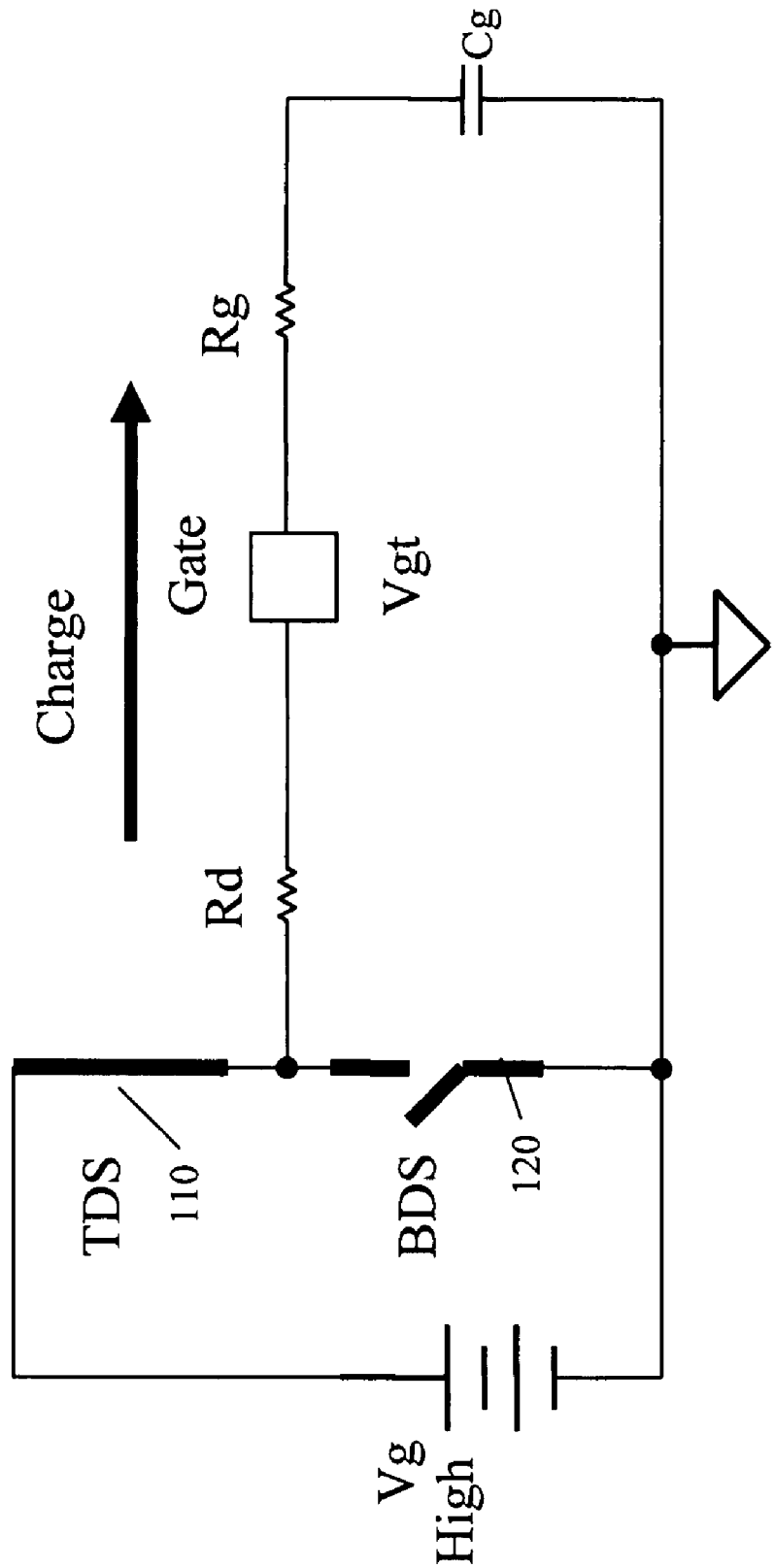
FIG. 6 illustrates the settings of a power switch driver in a first time interval.
Figure 7:
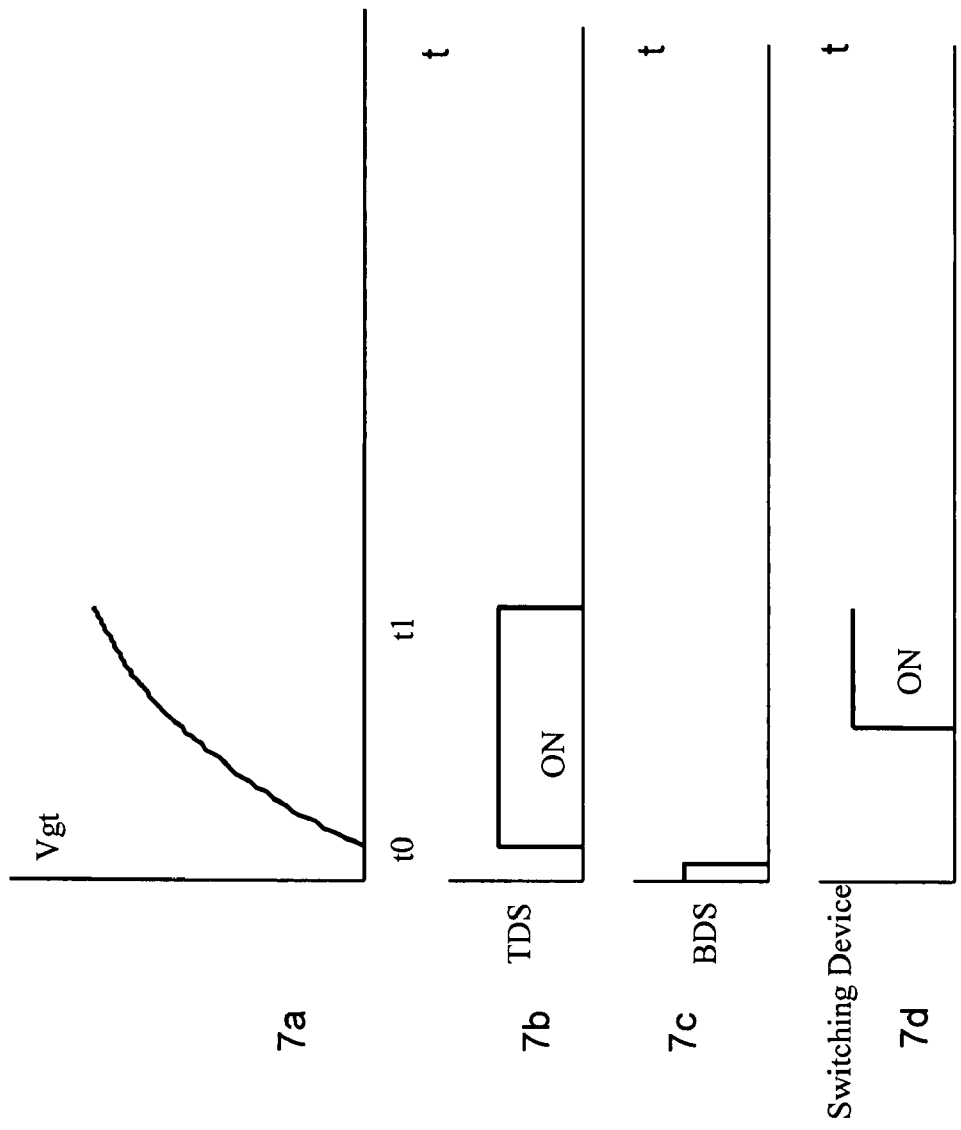
FIGS. 7a-d illustrate the timing diagrams of voltages and the status of devices in a first time interval.

FIG. 6 illustrates the settings of power driver 100 according to some embodiments, which carry out the first step of the above procedure. Top driver switch 110 is on and bottom driver switch 120 is turned off.

FIG. 7a illustrates that with these settings a gate voltage Vg0 is applied at time instance t0 to start the turning on of power switch 140. This leads to a rising transient gate voltage Vg(t).

FIGS. 7b-c illustrate that top driver switch 110 is switched on in this interval (starting at about t0), while bottom driver switch 120 is switched off in the same interval.

FIG. 7d illustrates that shortly after t0 Vg(t) passes the threshold voltage level Vth, turning power switch 140 on. These settings are applied until a time t1. The value of the gate voltage Vg(t) at this moment corresponds to the above mentioned first voltage level: Vg(t1)=Vg1.

Figure 8:
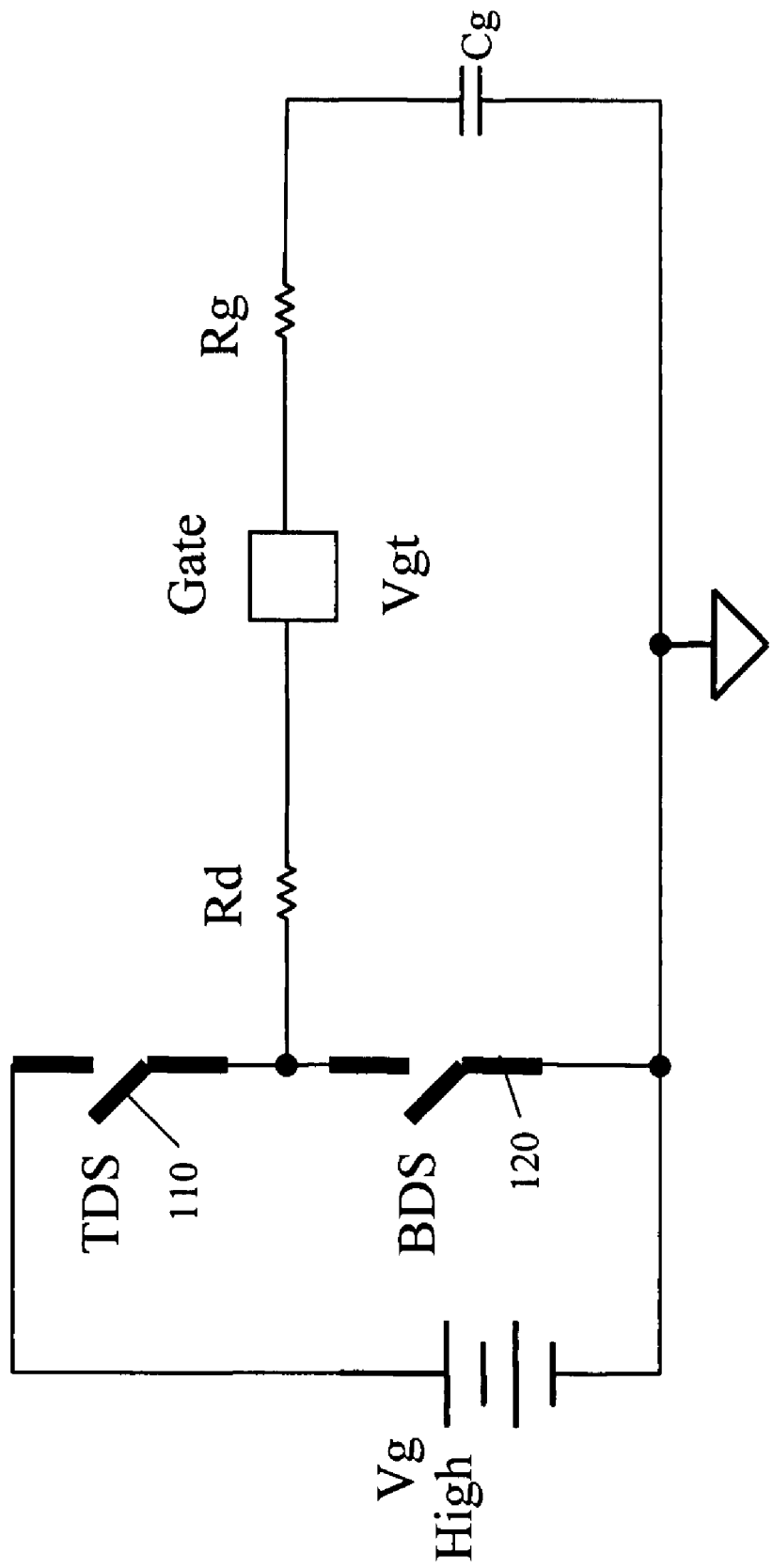
FIG. 8 illustrates the settings of a power switch driver in a second time interval.
Figure 9:
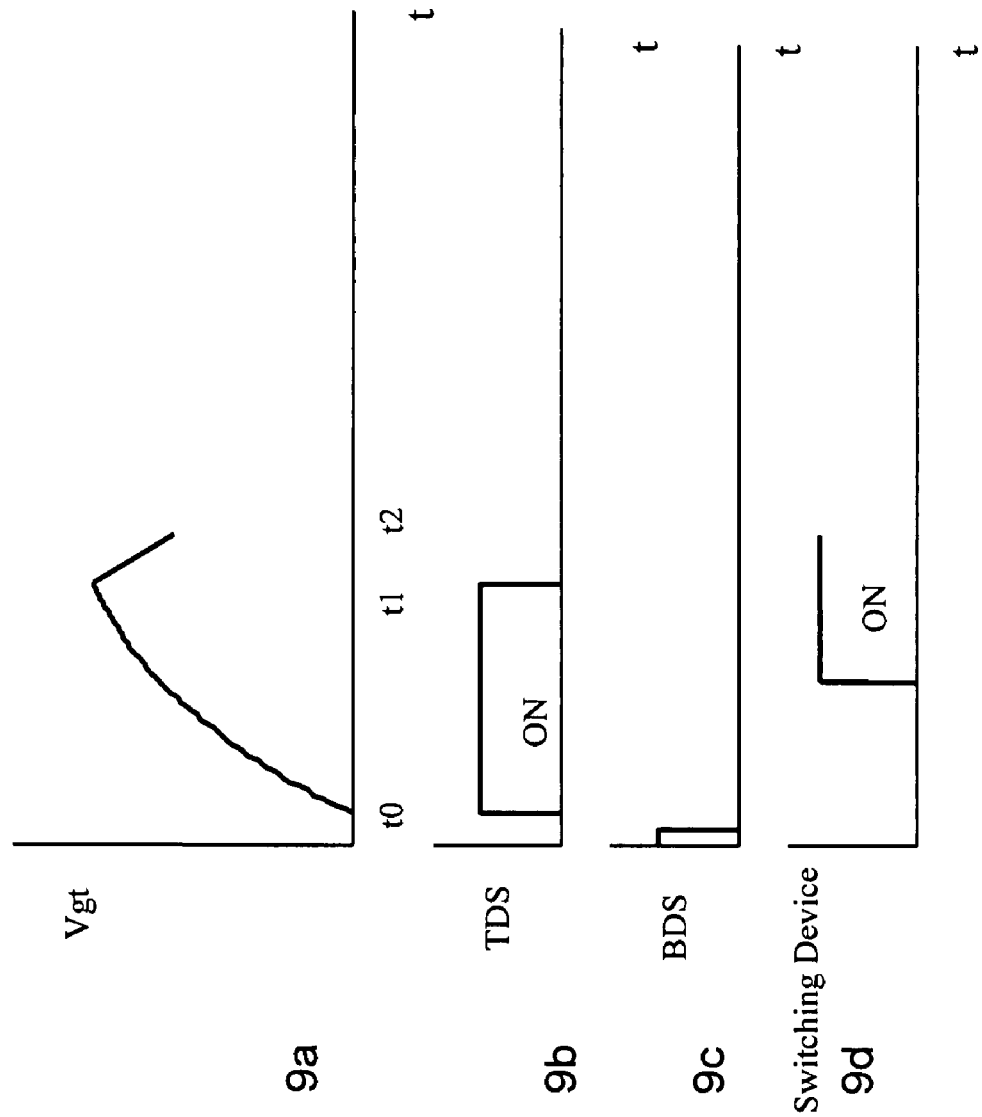
FIGS. 9a-d illustrate the timing diagrams of voltages and the status of devices in a second time interval.

FIG. 8 illustrates the settings of power switch driver 140 after time instance t1. After t1 both top driver switch 110 and bottom driver switch 120 are switched off. This setting cuts off the charging current, which flowed through resistor 148, gate resistor 146, and gate capacitor 147.

FIGS. 9a-d illustrate the corresponding timing diagrams.

FIG. 9a illustrates that Vg(t) at time instance t1 starts decaying from the first voltage level Vg1 as the charging current decays to zero with a time constant approximately τ=RgCg.

FIGS. 9b-c illustrate that after time instance t1 both top driver switch 110 and bottom driver switch 120 are turned off.

FIG. 9d illustrates that gate voltage Vg(t) is still well above threshold value Vth and thus power switch 140 is still on.

Figure 10:
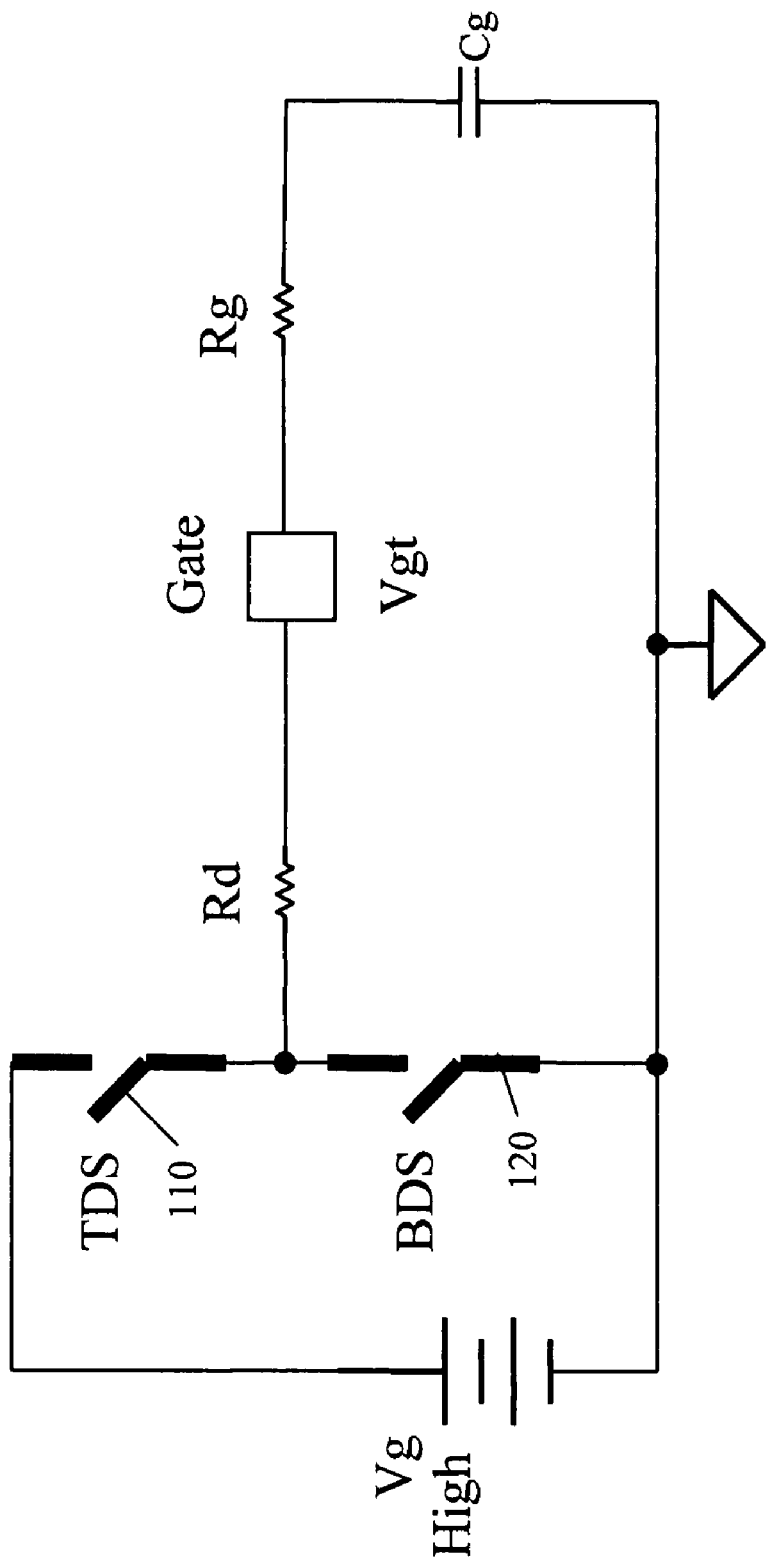
FIG. 10 illustrates the settings of a power switch driver in a third time interval.
Figure 11:
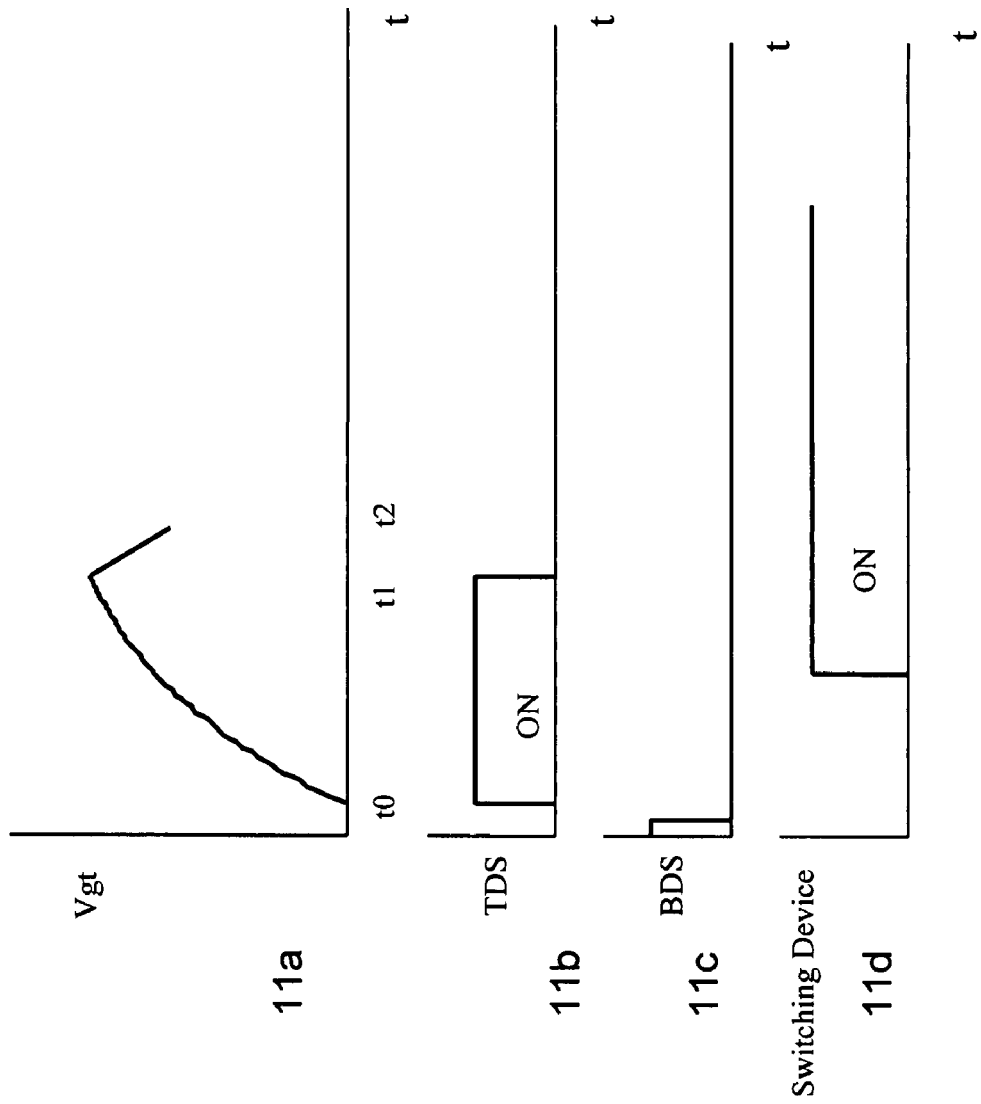
FIGS. 11a-d illustrate the timing diagrams of voltages and the status of devices in a third time interval.

FIG. 10 illustrates that the same settings are maintained for a longer period: again both top driver switch 110 and bottom driver switch 120 remain turned off.

FIG. 11a illustrates that after a short time the charging current is essentially stopped by time t2 and therefore the gate voltage Vg(t) does not change anymore. Vg(t) is equal to the voltage of gate capacitor 147. This voltage level corresponds to the second, lower voltage level, mentioned above: Vg(t2)=Vg2.

FIGS. 11b-c illustrate the setting of both top driver switch 110 and bottom driver switch 120 remaining turned off.

FIG. 11d illustrates that the voltage level Vg2 is sufficient to keep power switch 140 turned on.

Figure 12:
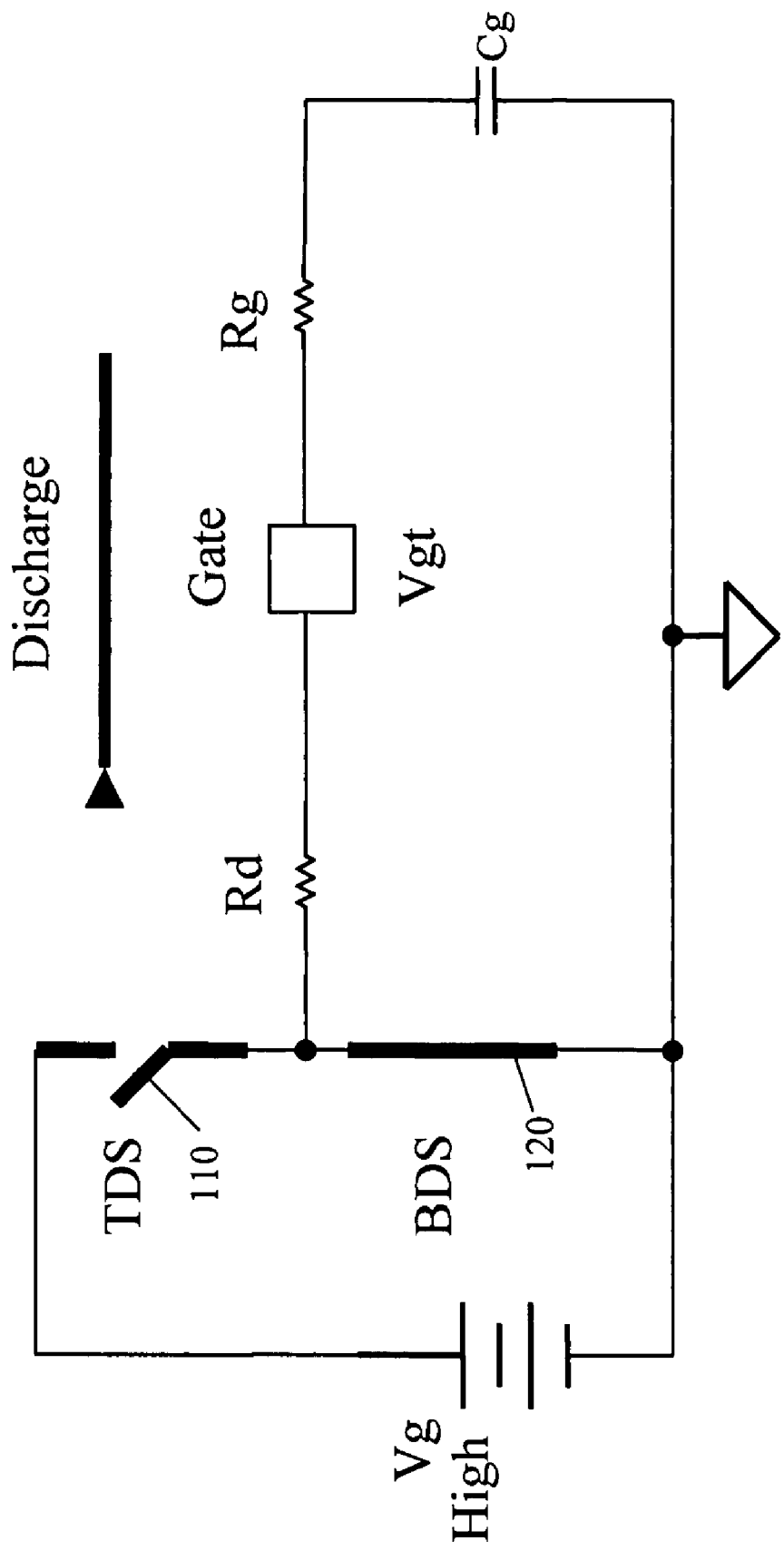
FIG. 12 illustrates the settings of a power switch driver in a fourth time interval.
Figure 13:
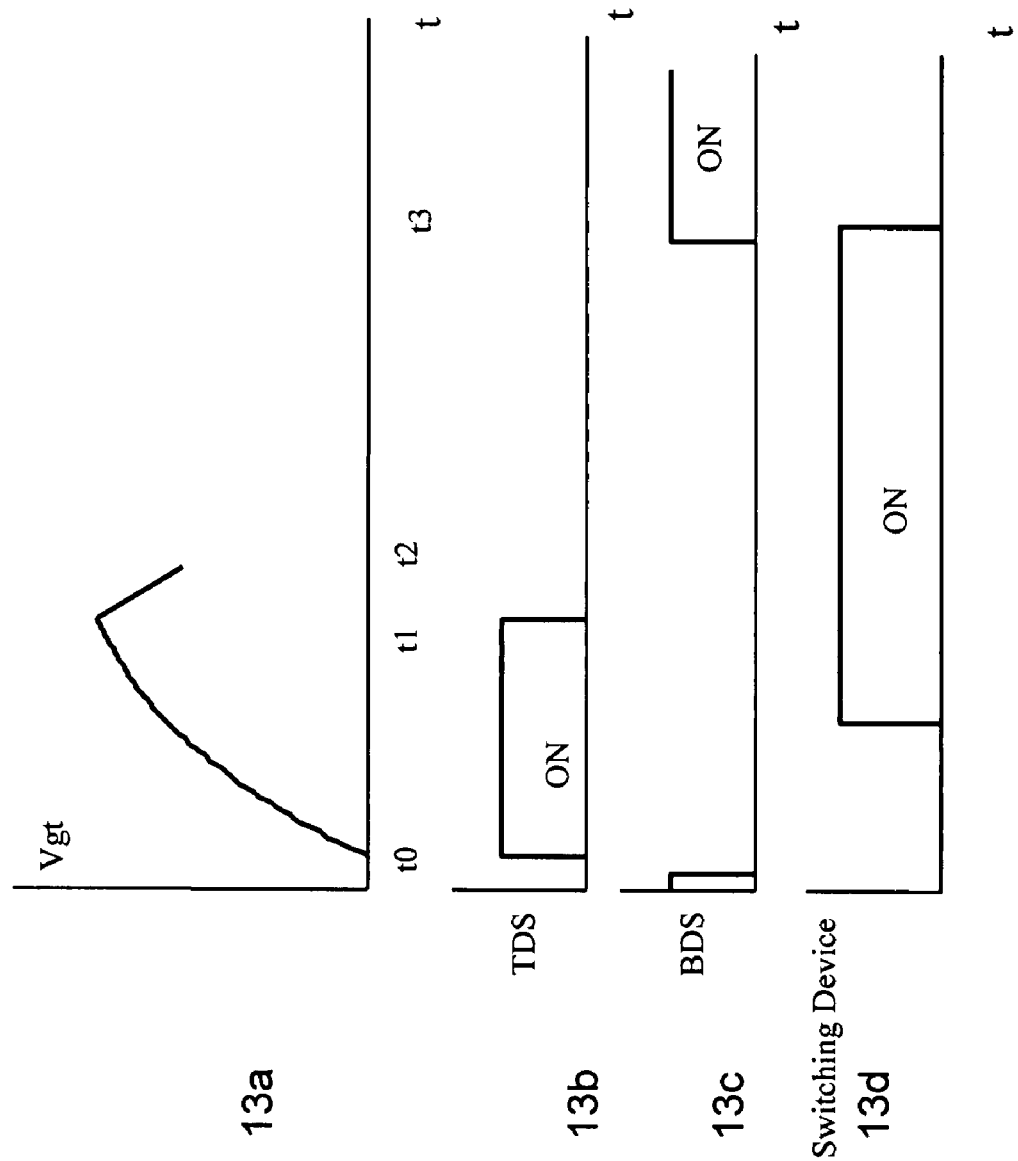
FIGS. 13a-d illustrate the timing diagrams of voltages and the status of devices in a fourth time interval.

FIG. 12 illustrates that after a suitably chosen time the settings of power switch 140 are changed at time instance t3: while top driver switch 110 is kept turned off, bottom driver switch 120 is turned on. These settings start the discharging of gate capacitor 147 through bottom driver switch 120.

FIG. 13a illustrates that the discharging process causes gate voltage Vg(t) to start decreasing at time instance t3 from the low value of Vg2.

FIG. 13b illustrates that top driver switch 110 remains turned off.

FIG. 13c illustrates that bottom driver 120 was turned at about the time distance t3.

FIG. 13d illustrates that after the discharging process started, Vg(t) decays below the threshold voltage Vth, at which point power switch 140 is turned off.

Figure 14:
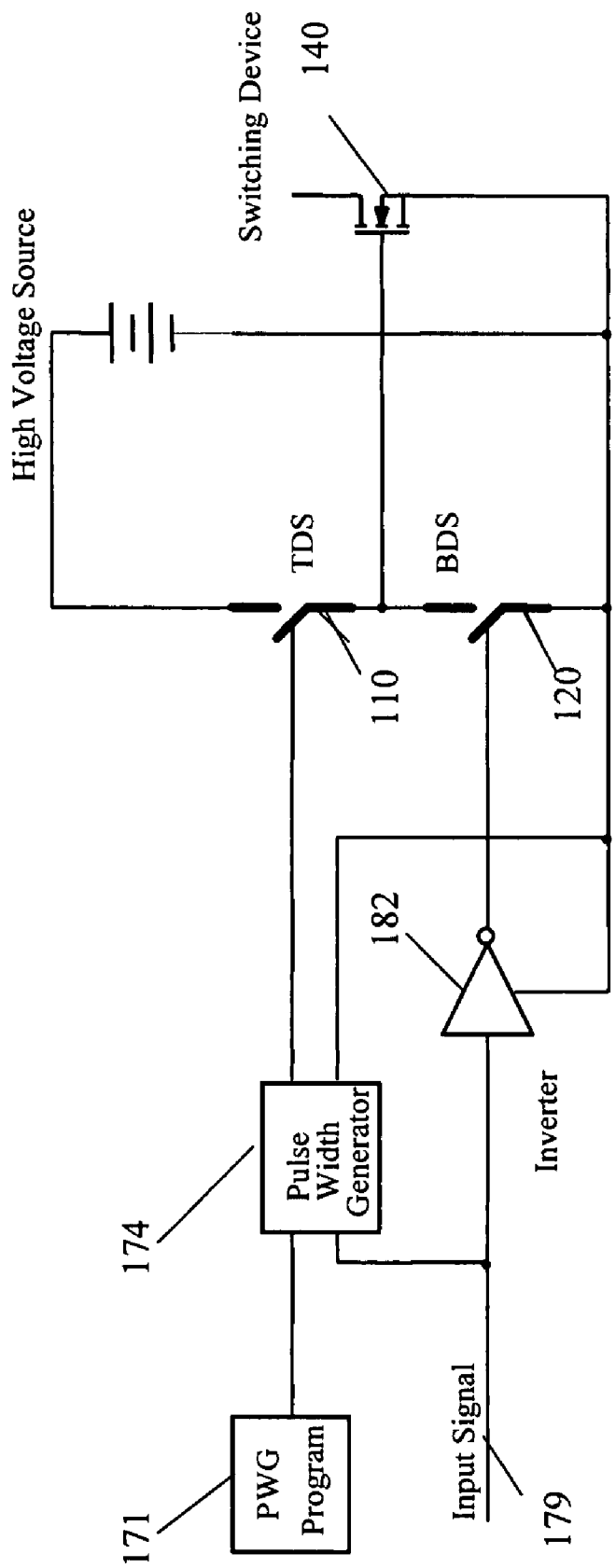
FIG. 14 illustrates an embodiment of a power switch driver.

FIG. 14 illustrates an embodiment of driver logic 135. In this embodiment driver logic 135 includes a pulse width generator programmer (PWG programmer) 171 and a pulse width generator (PWG) 174. A first input terminal of pulse width generator 174 is coupled to pulse width generator programmer 171. A second input terminal of pulse width generator 174 is coupled to an input terminal 179. A first output of pulse width generator 174 is coupled to a gate of top driver switch 110. Pulse width generator 174 is also coupled to second voltage rail 122, in some embodiments the ground. Input terminal 179 is also coupled to an inverter 182, the output of inverter 182 controlling a gate of bottom driver switch 120.

Figure 15:
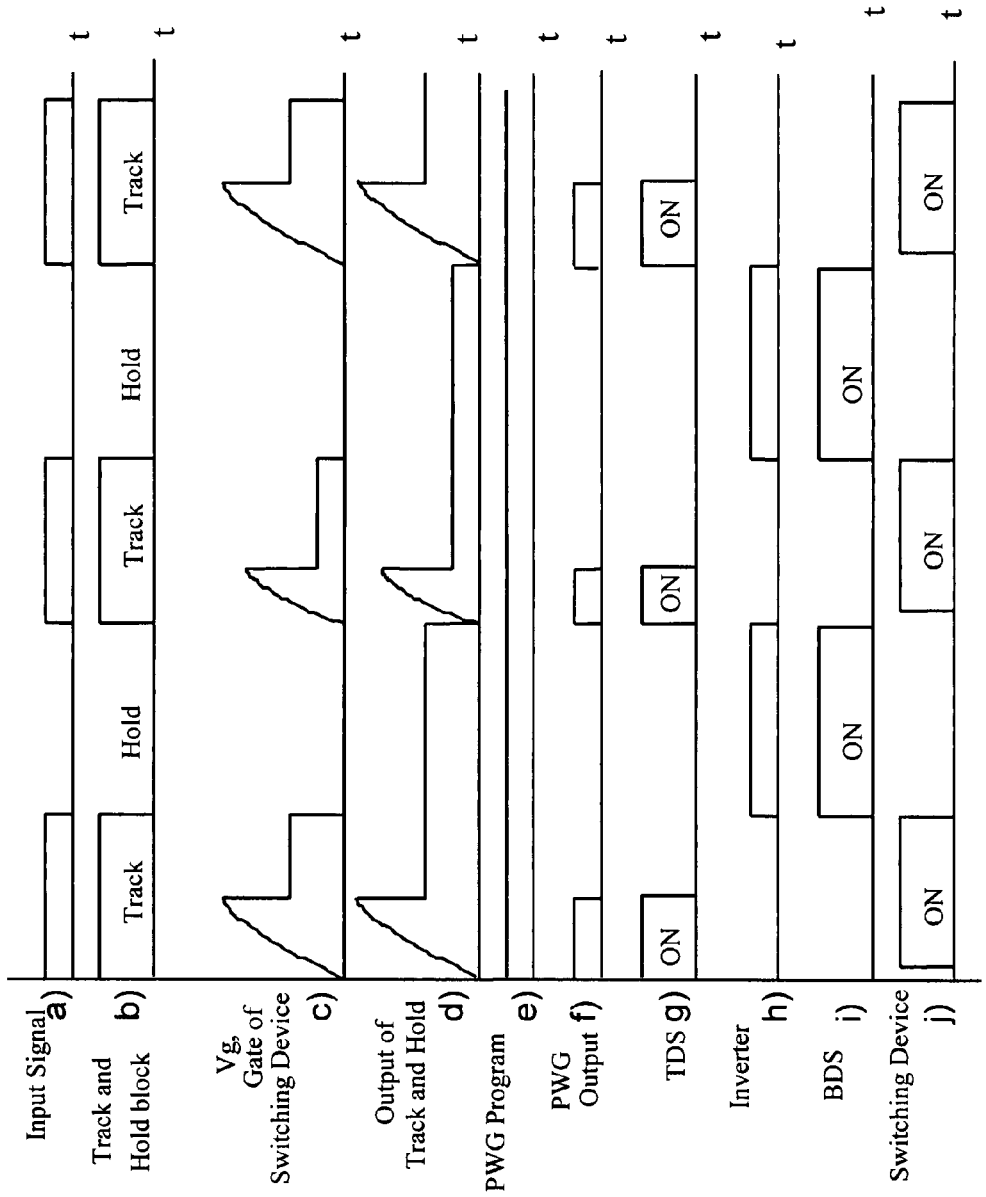
FIGS. 15a-j illustrate the timing diagrams of various voltages and the status of various devices in a power switch driver.

FIG. 15 illustrates timing diagrams. Only certain diagrams correspond to the just-described embodiment.

FIG. 15a illustrates the input signal assuming high and low values in an alternating manner. In some embodiments the input signal is periodic, but in others the input signal may vary aperiodically.

FIG. 15c illustrates the time dependence of Vg(t) as was discussed in relation to FIGS. 6-13. Vg(t) consists of the rising transient, stopped at t1 at a level Vg1, falling to Vg2 at time instance t2, and staying there until time instance t3. At time instance t3 Vg(t) falls to a low value, such as the ground.

FIG. 15e shows that one embodiment of Pulse Width Generator (PWG) Programmer 171 outputs a PWG program voltage, which is inputted into Pulse Width Generator (PWG) 174. The PWG program voltage determines the width of the pulses, outputted by PWG 174.

FIGS. 15f-g shows that the output of PWG 174 controls top driver switch 110. When the PWG voltage is high, top driver switch 110 is turned on, when the PWG voltage is low, top driver switch 110 is turned off.

FIGS. 15h-i show that bottom driver switch 120 is controlled by inverter 182. When the output voltage of inverter 182 is low, bottom driver switch 120 is turned off, when the output voltage of inverter 182 is high, bottom driver switch is turned on.

Finally, FIG. 15j shows that power switch 140 remains turned on until time instance t3, because the time instances (t0, t1, t2 and t3) and the corresponding time intervals were selected so that the Vg2 voltage is higher than Vth. This translates to the requirement that during the initial interval between t0 and t1 gate capacitor 146 is charged to a voltage, which is higher than Vth.

Figure 16:
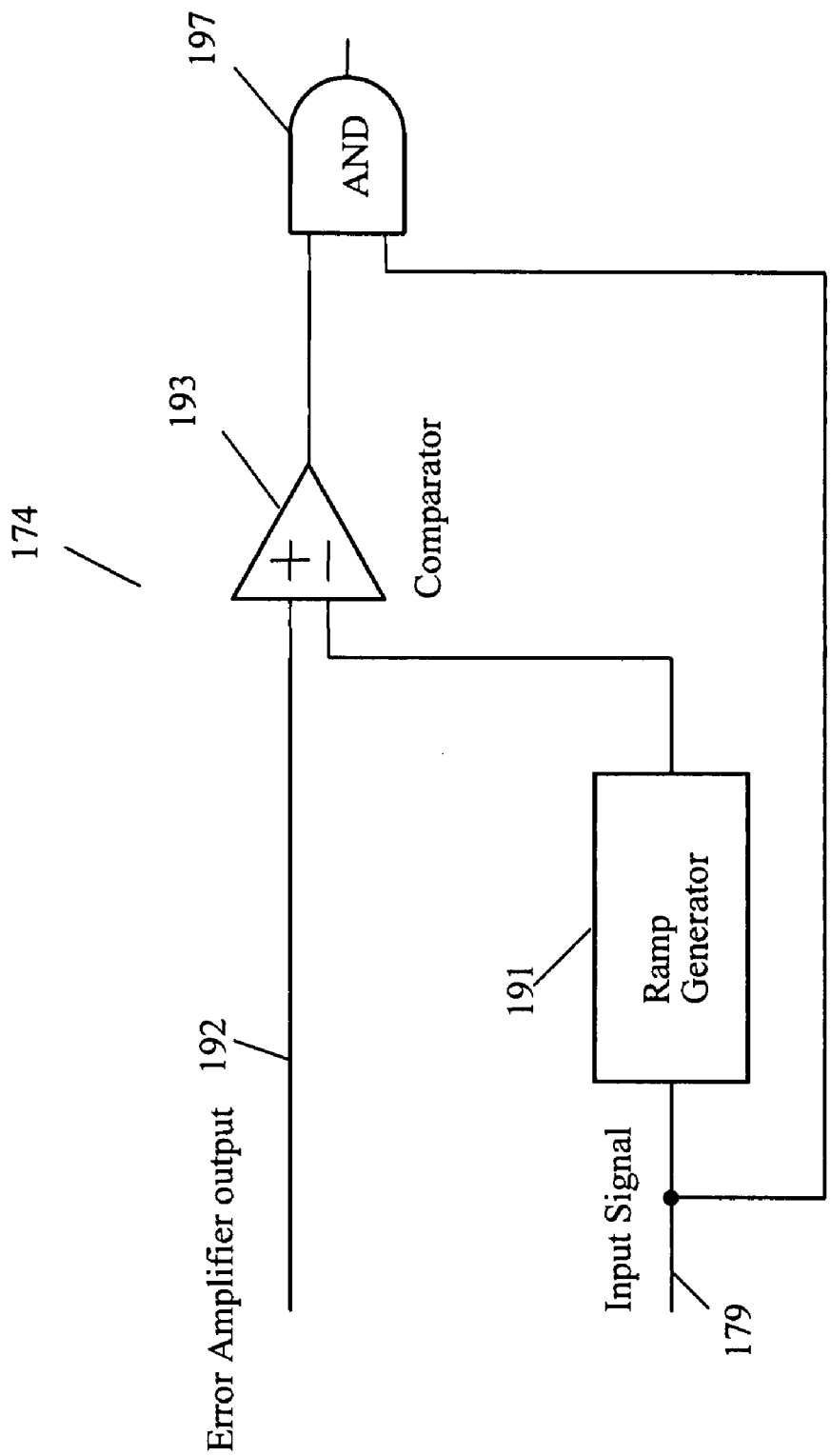
FIG. 16 illustrates an embodiment of a pulse width generator.

FIG. 16 illustrates that in some embodiments Pulse Width Generator 174 includes a comparator 193. The non-inverting input of comparator 193 is the first input terminal of PWG 174, coupled to PWG Programmer 171. Through this terminal PWG 174 receives a Vctrl PWG program voltage. The inverting input of comparator 193 is coupled to the output of a ramp generator 191. The input of ramp generator 191 is the second input terminal of PWG 174. Finally, the output of comparator 193 is one of the inputs of an AND gate 197. The other input of AND gate 197 is coupled to input terminal 179.

Figure 17:
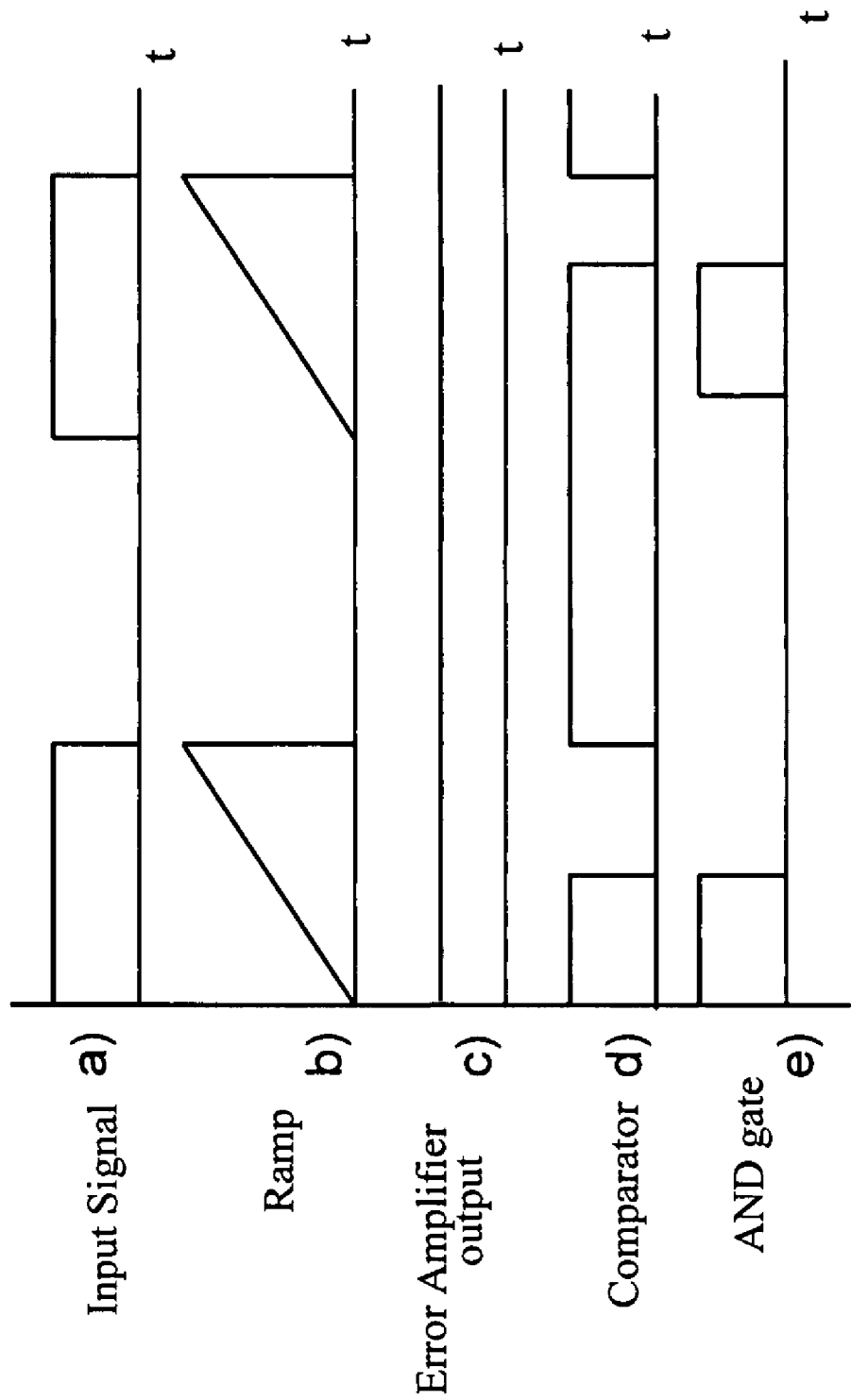
FIGS. 17a-e illustrate the timing diagrams of various voltages and the status of various devices in a pulse width generator.

FIG. 17 illustrates timing diagrams of PWG 174.

FIG. 17a illustrates an input signal, received at input terminal 179. The input signal is periodically changing between high and low values.

FIG. 17b illustrates that whenever the input signal is high, ramp generator 191 starts generating a steadily rising ramp signal Vramp.

FIG. 17c illustrates that in some embodiments PWG Programmer outputs a constant control voltage Vctrl, also referred to as PWG program voltage.

FIG. 17d illustrates that the rising ramp voltage Vramp and the constant PWG program voltage are both input into comparator 193. The output of comparator 193 is high as long as the ramp voltage is lower that the PWG voltage, but switches to low, when the ramp voltage exceeds the PWG program voltage.

FIG. 17e illustrates that, since both the input signal and the output of comparator 193 are input into AND gate 197, the output of AND gate 197 is high when both the input signal and the comparator output are either high or low. These timing diagrams demonstrate that the width of the pulses, outputted at AND gate 197 are controlled or programmed by the level of the PWG Program voltage.

However, changing temperature, changing load, or any other variation of the operating conditions may shift the pulse width away from its desired level. Therefore, in some embodiments, driver logic 135 employs a feedback loop 200 that senses the voltage at driver node 117 and adjusts the PWG program voltage accordingly.

A problem needs a solution, though. As FIGS. 15a through 15j illustrate, in a new cycle of operation, the PWG program voltage has to be adjusted according to the voltage Vg(t) outputted at driver node 117 in the previous cycle. However, the value of Vg(t) is not available at the time this adjustment needs to be made: Vg(t) already switched off at time instance t3.

Figure 18:
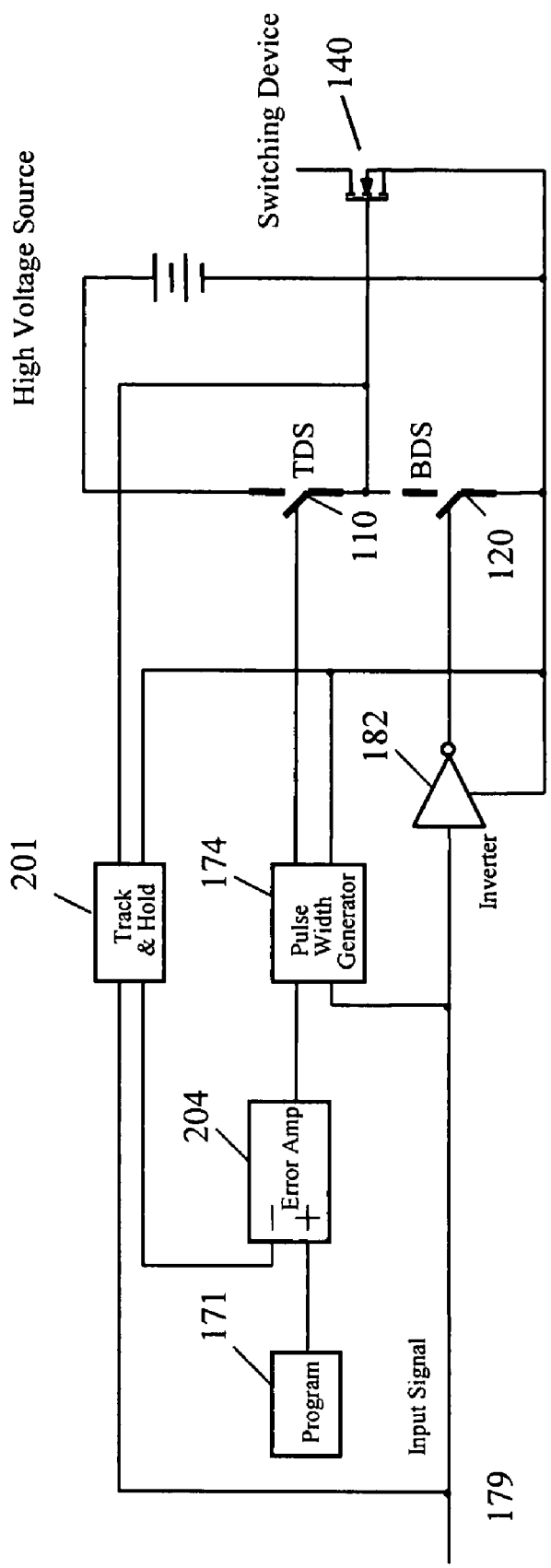
FIG. 18 illustrates an embodiment of a power switch driver with a track and hold feedback.

FIG. 18 illustrates a feedback loop system, which solves this problem. Feedback loop 200 includes a track and hold circuit 201 and an error amplifier 204. The sensing terminal of track and hold circuit 201 is coupled to driver node 117 and the control terminal is coupled to input terminal 179. The output terminal of track and hold circuit 201 is coupled to the inverting input of error amplifier 204. The non-inverting input of error amplifier 204 is coupled to PWG Programmer 171. The output terminal of error amplifier 204 is coupled into PWG 174.

FIGS. 15a through 15j illustrate timing diagrams of embodiments with a track and hold circuit 201. The previously described timing diagrams are relevant for this embodiment as well.

FIG. 15b illustrates that in addition the input signal controls whether track and hold circuit 201 should carry out the "track" or the "hold" function. When input signal is high, track and hold circuit 201 tracks the signal sensed at its sensing terminal and outputs it. When the input signal switches to low, track and hold circuit 201 holds the sensed signal it tracked up to that point and keeps outputting the last sensed value.

FIG. 15d illustrates that, accordingly, in the time interval t0-t3 the output of track and hold circuit 201 tracks, and in some cases essentially equals, Vg(t). After time instance t3 track and hold circuit 201 simply holds and outputs the last sensed value, corresponding to Vg2. This value is held until the input signal changes to high again.

FIG. 15 illustrate that the described track and hold embodiment indeed holds the last voltage Vg2 until the next cycle begins. This allows PWG Program block 171 to adjust the PWG program voltage, thus adjusting the width of the outputted pulses to the desired value.

Figure 19:
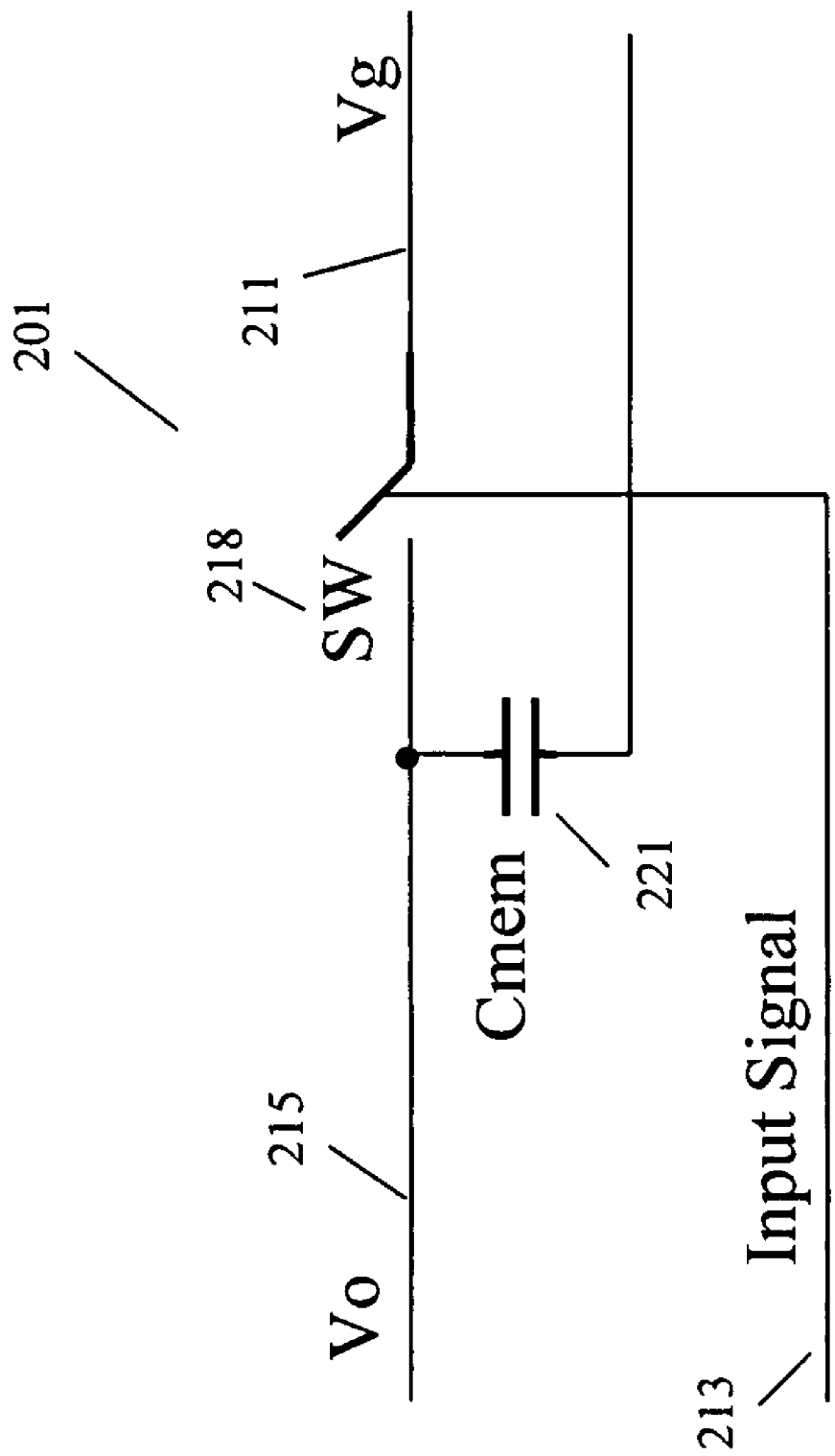
FIG. 19 illustrates an embodiment of a track and hold block.

FIG. 19 illustrates a particular embodiment of track and hold circuit 201. Sensing terminal 211 receives the voltage of driver node 117, gate voltage Vg(t). Control terminal 213 receives the input signal. Track and hold circuit 201 outputs a voltage V0 at its output terminal 215.

Sensing terminal 211 couples the sensed voltage Vg(t) onto memory capacitor Cmem 221 through switch 218. When switch 218 is turned on, the voltage of memory capacitor Cmem 221 charges up to Vg(t). Since the inputted voltage Vg(t) is outputted at output terminal 215, this is called the "tracking" mode. However, when the input signal turns switch 218 off, the charging of memory capacitor is stopped and its voltage remains at the last voltage it was charged to. Since this last voltage keeps being outputted at output terminal 215, this mode is called "hold". A large number of other track and hold circuits are known in the art and can be used in the present embodiment.

Figure 20:
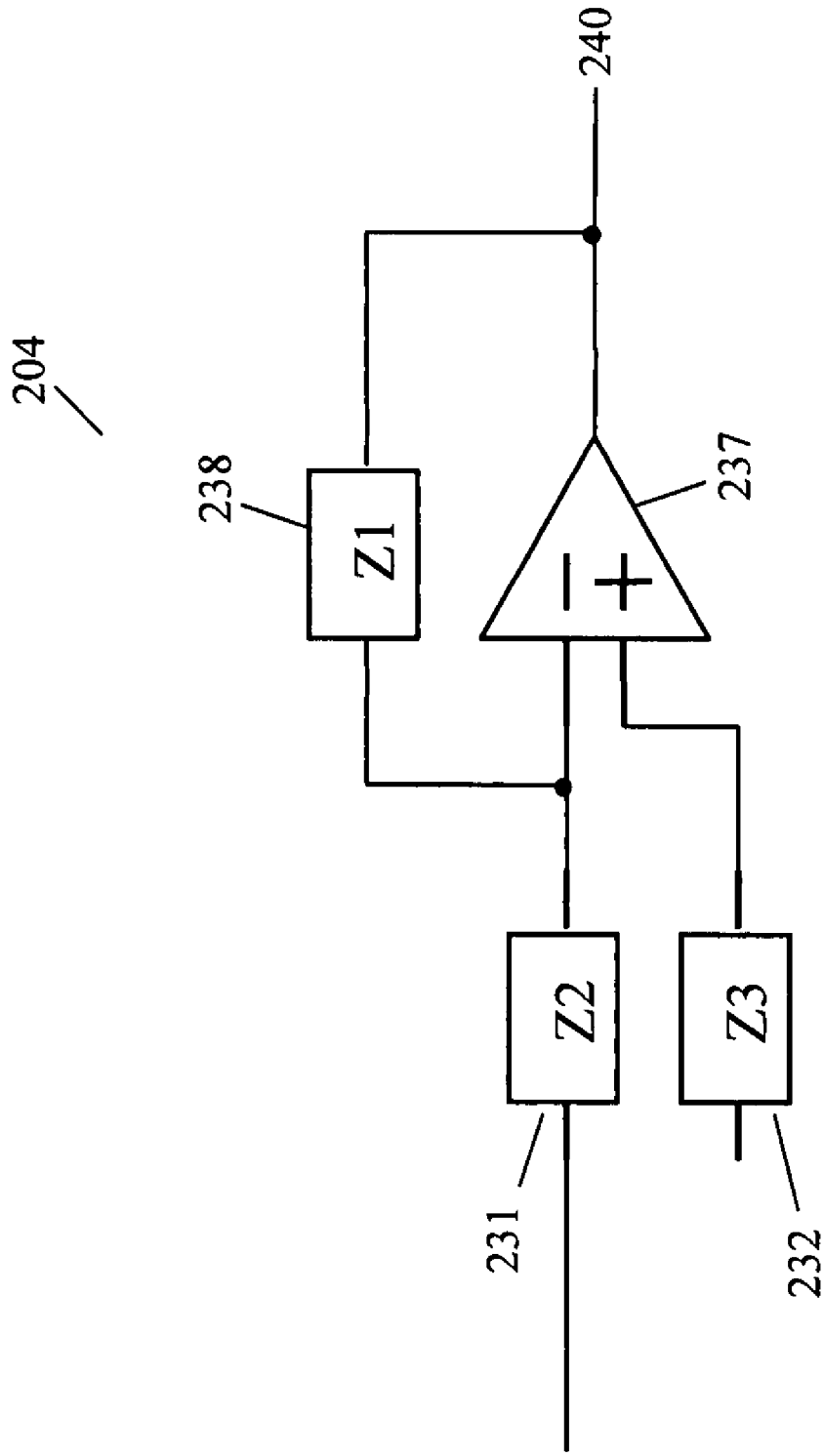
FIG. 20 illustrates an embodiment of an error amplifier.

FIG. 20 illustrates an embodiment of error amplifier 204. The two input terminals of error amplifier 204 are coupled through impedances 231 and 232 into the inverting and non-inverting inputs of error comparator 237. In some embodiments an additional impedance 238 bridges error comparator 237. The result of the comparison is outputted at error output terminal 240. As FIG. 18 illustrated, track and hold circuit 201 is coupled into the inverting input terminal of error amplifier 204 and PWG Program voltage is coupled into the non-inverting input of error amplifier 204. Output terminal 240 is coupled into Pulse Width Generator 174.

In operation, in this embodiment the Program voltage inputted into Pulse Width Generator 174 is modified from its value from PWG Programmer 171 by Error amplifier 204. This implementation can overcome the variations in the operating conditions mentioned above.

Although the present invention and its advantages have been described in detail, it should be understood that various changes, substitutions, and alterations can be made therein without departing from the spirit and scope of the invention as defined by the appended claims. That is, the discussion included in this application is intended to serve as a basic description. It should be understood that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Neither the description nor the terminology is intended to limit the scope of the claims.

What is claimed is:

1. A power switch driver comprising:

a top driver switch coupled between a first voltage rail and a driver node;

a bottom driver switch coupled between the driver node and a second voltage rail; and driver logic operationally coupled to the top driver switch and the bottom driver switch;

wherein the power switch driver is connectable to a power switch; and wherein the power switch driver is operable to turn on the power switch by controlling a gate voltage of the power switch to a first voltage level and to turn off the power switch by controlling the gate voltage from a second voltage level, wherein the second voltage level is lower than the first voltage level;

wherein the driver logic comprises:

a pulse width generator programmer;

a pulse width generator coupled to the second voltage rail and having a first input terminal, a second input terminal, and a first output terminal, wherein the first input terminal of the pulse width generator is coupled to the pulse width generator programmer, wherein the second input terminal of the pulse width generator is coupled to an input terminal, wherein the first output terminal of the pulse width generator is coupled to a gate of the top driver switch;

wherein the pulse width generator comprises:

a comparator having a non-inverting input terminal, an inverting input terminal, and an output terminal, the non-inverting input terminal of the comparator being the first input terminal of the pulse width generator;

a ramp generator having an input terminal and an output terminal, the input terminal of the ramp generator being the second input terminal of the pulse width generator and the output terminal of the ramp generator being coupled to the inverting input terminal of the comparator; and an AND gate having a first input terminal and a second input terminal, the first input terminal of the AND gate coupled to the output terminal of the comparator and the second input terminal of the AND gate coupled to the input terminal of the ramp generator.

2. The power switch driver of claim 1, wherein the power switch driver is connectable to the power switch by coupling a gate of the power switch to the driver node; and coupling a source of the power switch to the second voltage rail.

3. The power switch driver of claim 1, wherein the power switch is one of an n-channel MOSFET, a p-channel MOSFET, bipolar transistor and an insulated gate bipolar transistor.

4. The power switch driver of claim 1, wherein one of the first and second input terminals is coupled to a gate of the bottom driver switch through an inverter.

5. The power switch driver of claim 1, wherein the pulse width generator programmer is a control voltage source.

6. The power switch driver of claim 1, further comprising:
a feedback loop, coupled to the driver node and to the driver logic.

7. A power switch driver comprising:

a top driver switch coupled between a first voltage rail and a driver node;

a bottom driver switch coupled between the driver node and a second voltage rail;

driver logic operationally coupled to the top driver switch and the bottom driver switch;

wherein the power switch driver is connectable to a power switch; and wherein the power switch driver is operable to turn on the power switch by controlling a gate voltage of the power switch to a first voltage level and to turn off the power switch by controlling the gate voltage from a second voltage level, wherein the second voltage level is lower than the first voltage level;

wherein the driver logic comprises:

a pulse width generator programmer; and a pulse width generator coupled to the second voltage rail and having a first input terminal, a second input terminal, and a first output terminal, wherein the first input terminal of the pulse width generator is coupled to the pulse width generator programmer, wherein the second input terminal of the pulse width generator is coupled to an input terminal, wherein the first output terminal of the pulse width generator is coupled to a gate of the top driver switch; and a feedback loop coupled to the driver node and to the driver logic, the feedback loop comprising a track-and-hold circuit; coupled to the driver node, to the pulse width generator through an error amplifier, and to the input terminal.

8. The power switch driver of claim 7, wherein
the track-and-hold block is coupled to an inverting input terminal of the error amplifier; and
the pulse width generator programmer is coupled to a non-inverting input terminal of the error amplifier.

9. The power switch driver of claim 7, wherein the track-and-hold block comprises:

a sensing terminal, coupled to the driver node;

a control terminal, coupled to the input terminal;

an output terminal;

a switch, coupled between the sensing terminal and the output terminal;

the switch comprising a gate coupled to the control terminal and controlled by an input signal; and a memory capacitor, coupled to the output terminal.

10. A power switch driver circuit for driving a power switch, the power switch driver circuit comprising:

a top driver switch and a bottom driver switch coupled at a driver node to the power switch; and a pulse width generator programmer and a pulse width generator for providing pulse width modulation (PWM) control signals to at least one of the top driver switch and the bottom driver switch for driving the power switch, the pulse width generator comprising:

a comparator having a non-inverting input terminal, an inverting input terminal, and an output terminal, the non-inverting input terminal of the comparator coupled to the pulse width generator programmer;

a ramp generator having an input terminal and an output terminal, the output terminal of the ramp generator being coupled to the inverting input terminal of the comparator; and an AND gate having a first input terminal, a second input terminal, and an output terminal, the first input terminal of the AND gate coupled to the output terminal of the comparator, the second input terminal of the AND gate coupled to the input terminal of the ramp generator, and the output terminal of the AND gate coupled to the top driver switch;

wherein the power switch driver circuit is operable to turn on the power switch by controlling a gate voltage of the power switch to a first voltage level and to turn off the power switch by controlling the gate voltage from a second voltage level, wherein the second voltage level is lower than the first voltage level.

11. The power switch driver circuit of claim 10, wherein the power switch driver circuit is connectable to the power switch by coupling a gate of the power switch to the driver node and coupling a source of the power switch to the second voltage rail.

12. The power switch driver circuit of claim 10, wherein the power switch is one of an n-channel MOSFET, a p-channel MOSFET, bipolar transistor and an insulated gate bipolar transistor.

13. The power switch driver circuit of claim 10, wherein the pulse width generator programmer comprises a control voltage source.

14. The power switch driver of claim 10, comprising a feedback loop coupled to the driver node and to the pulse width generator.

15. The power switch driver of claim 10, comprising a track-and-hold circuit coupled to the driver node and to the pulse width generator through an error amplifier.

16. A power switch driver circuit for driving a power switch, the power switch driver circuit comprising:
  a top driver switch and a bottom driver switch coupled at a driver node to the power switch;
  driver logic for providing control signals to the top driver switch and the bottom driver switch for driving the power switch at the driver node, the driver logic comprising:
    a pulse width generator programmer; and
    a pulse width generator having a first input terminal, a second input terminal, and a first output terminal, wherein the first input terminal of the pulse width generator is coupled to the pulse width generator programmer, wherein the second input terminal of the pulse width generator is coupled to an input terminal, wherein the first output terminal of the pulse width generator is coupled to the top driver switch;
    wherein the pulse width generator programmer and the pulse width generator generate at least a portion of the control signals; and
  a feedback loop for providing a feedback signal to the driver logic, the feedback loop comprising a track-and-hold circuit for tracking and holding a value of voltage at the driver node;
  wherein the power switch driver circuit is operable to turn on the power switch by controlling a gate voltage of the power switch to a first voltage level and to turn off the power switch by controlling the gate voltage from a second voltage level, wherein the second voltage level is lower than the first voltage level.

17. The power switch driver circuit of claim 16, wherein the power switch driver circuit is connectable to the power switch by coupling a gate of the power switch to the driver node.

18. The power switch driver circuit of claim 16, wherein the power switch is one of an n-channel MOSFET, a p-channel MOSFET, bipolar transistor and an insulated gate bipolar transistor.

19. The power switch driver circuit of claim 16, wherein the pulse width generator programmer comprises a control voltage source.

* * * * *